US010407340B2

(12) United States Patent
Nakakita

(10) Patent No.: US 10,407,340 B2
(45) Date of Patent: Sep. 10, 2019

(54) GLASS COMPOSITION, GLASS POWDER, CONDUCTIVE PASTE, AND SOLAR CELL

(71) Applicant: AGC INC., Chiyoda-ku (JP)

(72) Inventor: Yosuke Nakakita, Fukushima (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 16/183,112

(22) Filed: Nov. 7, 2018

(65) Prior Publication Data

US 2019/0135682 A1   May 9, 2019

(30) Foreign Application Priority Data

Nov. 8, 2017   (JP) .................. 2017-215522

(51) Int. Cl.
| | |
|---|---|
| *C03C 8/18* | (2006.01) |
| *C03C 3/21* | (2006.01) |
| *C03C 8/10* | (2006.01) |
| *C03C 4/14* | (2006.01) |
| *H01L 31/0224* | (2006.01) |
| *C03C 8/12* | (2006.01) |
| *H01B 1/16* | (2006.01) |

(52) U.S. Cl.
CPC .................. *C03C 8/18* (2013.01); *C03C 3/21* (2013.01); *C03C 4/14* (2013.01); *C03C 8/10* (2013.01); *C03C 8/12* (2013.01); *H01B 1/16* (2013.01); *H01L 31/022425* (2013.01); *C03C 2204/00* (2013.01); *C03C 2205/00* (2013.01)

(58) Field of Classification Search
CPC .. H01B 1/16; H01L 35/14; C03C 3/16; C03C 3/21; C03C 14/006
See application file for complete search history.

(56) References Cited

U.S. PATENT DOCUMENTS

| 3,988,697 A * | 10/1976 | Cooley ................. H01S 3/0604 372/67 |
| 4,997,718 A * | 3/1991 | Dumesnil ................. C03C 3/16 106/1.23 |
| 2014/0038346 A1* | 2/2014 | Hang ................. H01L 31/02242 438/98 |
| 2015/0072463 A1* | 3/2015 | Yang ................. H01L 31/02242 438/72 |

(Continued)

FOREIGN PATENT DOCUMENTS

| RU | 02016863 | * | 7/1994 |
| WO | WO 2013/103087 A1 | | 7/2013 |
| WO | WO 2015/012353 A1 | | 1/2015 |

OTHER PUBLICATIONS

Bobkova et al "Low melting low-lead glasses . . . ", Glass and Ceramics, vol. 67, Nos. 1-2, 2010. (Year: 2010).*

(Continued)

*Primary Examiner* — Mark Kopec
(74) *Attorney, Agent, or Firm* — Oblon, McClelland, Maier & Neustadt, L.L.P.

(57) ABSTRACT

A glass composition includes, as expressed by mol % in terms of oxide, from 15 to 40% of PbO, from 25 to 50% of $MoO_3$, from 5 to 25% of $P_2O_5$ and from 7 to 15% of ZnO. A glass powder includes the glass composition. The glass powder has $D_{50}$ of from 0.3 to 2.0 μm, where $D_{50}$ is a 50% particle diameter in a volume-based cumulative particle size distribution.

18 Claims, 1 Drawing Sheet

(56) References Cited

U.S. PATENT DOCUMENTS

2016/0155868 A1 6/2016 Takahashi et al.

OTHER PUBLICATIONS

Koudelka, L., et al. "Structural study of PbO—$MoO_3$—$P_2O_5$ glasses by Raman and NMR spectroscopy", Journal of Non-Crystalline Solids, vol. 357, Issue 15, 2011, 6 pages.

* cited by examiner

GLASS COMPOSITION, GLASS POWDER, CONDUCTIVE PASTE, AND SOLAR CELL

BACKGROUND OF THE INVENTION

Technical Field

The present invention relates to a glass composition, a glass powder, a conductive paste, and a solar cell. More specifically, the present invention relates to a glass composition and a glass powder, which are suitable for the formation of an electrode of a solar cell, and further relates to a conductive paste using the same and a solar cell having an electrode formed from the conductive paste.

Background Art

Conventionally, an electronic device fabricated by forming a conductive layer functioning as an electrode on a semiconductor substrate such as silicon (Si) has been used for various applications. The conductive layer functioning as an electrode is formed by coating a semiconductor substrate with a conductive paste including an organic vehicle in which a conductive metal powder, such as silver (Ag), aluminum (Al) or copper (Cu), and a glass powder are dispersed, and firing the paste at a temperature necessary for the formation of an electrode.

The above-described technique for forming an electrode on a semiconductor substrate is applied also to the formation of an electrode on a pn-junction type semiconductor substrate in a solar cell. For example, Patent Document 1 describes, as a glass for use in an electrode formed on a light-receiving surface of a solar cell, the electrode penetrating an antireflection film, a lead-based glass having good penetrability through the antireflection film and causing less reduction in the conversion efficiency of the solar cell when the electrode is formed. In Patent Document 1, a composition containing, in mass %, from 60 to 95% of PbO, from 0 to 10% of $B_2O_5$, and from 1 to 30% of $SiO_2+Al_2O_3$ is disclosed as a specific glass composition. However, in the glass composition described in Patent Document 1, the content of PbO is too large, and therefore, the glass reacts sufficiently and excessively with the antireflection film on the semiconductor substrate such as silicon or with the silicon substrate itself, giving rise to a problem that the electrical properties are deteriorated.

Patent Document 2 describes a glass composition for use in an electrode formed on the light-receiving surface of a solar cell, which is a molybdenum-based glass composition which leads to the properties that the contact resistance with an impurity diffusive layer is low and the conversion efficiency of a solar cell is less likely to be reduced when the electrode is formed. However, the glass composition described in Patent Document 2 contains a very large amount of $MoO_3$, and thus, the glass composition has high conductivity. Accordingly, the glass composition is used for a conductive paste in an electrode of a solar cell, but the glass composition does not contain PbO, and therefore, the glass composition cannot sufficiently react with an antireflection film on a silicon substrate or with the silicon substrate itself when the electrode is formed, giving rise to a problem that the properties as a solar cell are not stabilized.

In addition, Non-Patent Document 1 discloses, as a specific glass composition, a composition containing, in mol %, from 15 to 50% of PbO, from 0 to 70% of $MoO_3$, and from 15 to 50% of $P_2O_5$, but when the glass is used for an electrode formed on a semiconductor substrate, good electrical properties cannot be obtained.

Patent Document 1: WO 2013/103087 A1
Patent Document 2: WO 2015/012353 A1
Non-Patent Document 1: Journal of Non-Crystalline Solids, p. 2816, Vol. 357, Issue 15, 15 July 2011

SUMMARY OF THE INVENTION

As regards the glass composition used for the formation of an electrode of a solar cell, a number of techniques for enhancing the electrode formability have been developed as seen in Patent Documents 1 and 2. However, a technique of adjusting the composition of glass or the particle size distribution of powder in a glass powder used for electrode formation, particularly in a lead-based glass powder, so as to decrease the electrical resistance between the electrode and the semiconductor substrate and enhance the conversion efficiency of a solar cell is under development.

An object of the present invention is to provide a glass composition for use in the formation of an electrode on a semiconductor substrate, in which the glass composition can appropriately react with an antireflection film on a semiconductor substrate such as silicon or with the silicon substrate itself when the electrode is formed and can enhance the conversion efficiency of a solar cell due to high conductivity of the glass itself, a glass powder including the glass composition, a conductive paste containing the glass powder, and a solar cell having conversion efficiency enhanced by using the conductive paste.

The present invention provides the following glass composition, glass powder, conductive past and solar cell.

[1] A glass composition comprising, as expressed by mol % in terms of oxide:
from 15 to 40% of PbO;
from 25 to 50% of $MoO_3$;
from 5 to 25% of $P_2O_5$; and
from 7 to 15% of ZnO.

[2] The glass composition according to [1], further comprising, expressed by mol % in terms of oxide, from 1 to 15% of $Li_2O$.

[3] The glass composition according to [1] or [2], further comprising, expressed by mol % in terms of oxide, from 1 to 25% of $WO_3$.

[4] The glass composition according to any one of [1] to [3], which has a glass transition temperature of from 300 to 450° C.

[5] A glass powder comprising the glass composition according to any one of [1] to [4], which has $D_{50}$ of from 0.3 to 2.0 μm,
wherein $D_{50}$ is a 50% particle diameter in a volume-based cumulative particle size distribution.

[6] A conductive paste comprising the glass powder according to [5], a conductive metal powder, and an organic vehicle.

[7] A solar cell comprising an electrode formed with the conductive paste according to [6].

When the glass composition or the glass powder including the glass composition according to the present invention is used together with a conductive component for a conductive paste, the glass composition appropriately reacts with an antireflection film on a semiconductor substrate such as silicon or with the silicon substrate and the glass itself has conductivity, so that the conductivity of the obtained electrode can be increased and the conversion efficiency of a solar cell can be enhanced.

Furthermore, the glass composition of the present invention has a low glass transition temperature so as to enable sintering at low temperatures. Accordingly, the composition has sufficient fluidity during sintering even at low temperatures, enables stabilization of properties, and can satisfactorily cope with the case where sintering within a short time is required.

In the present invention, the glass composition can be milled to form a glass powder, and use of the glass powder makes it possible to satisfactorily disperse the glass powder in a conductive paste. Consequently, the obtained conductive paste can contribute to stabilization of conductivity or enhancement of electrical properties of an electronic device. When such a conductive paste is used, a solar cell having enhanced conversion efficiency is obtained.

DETAILED DESCRIPTION OF THE INVENTION

Figure 1:
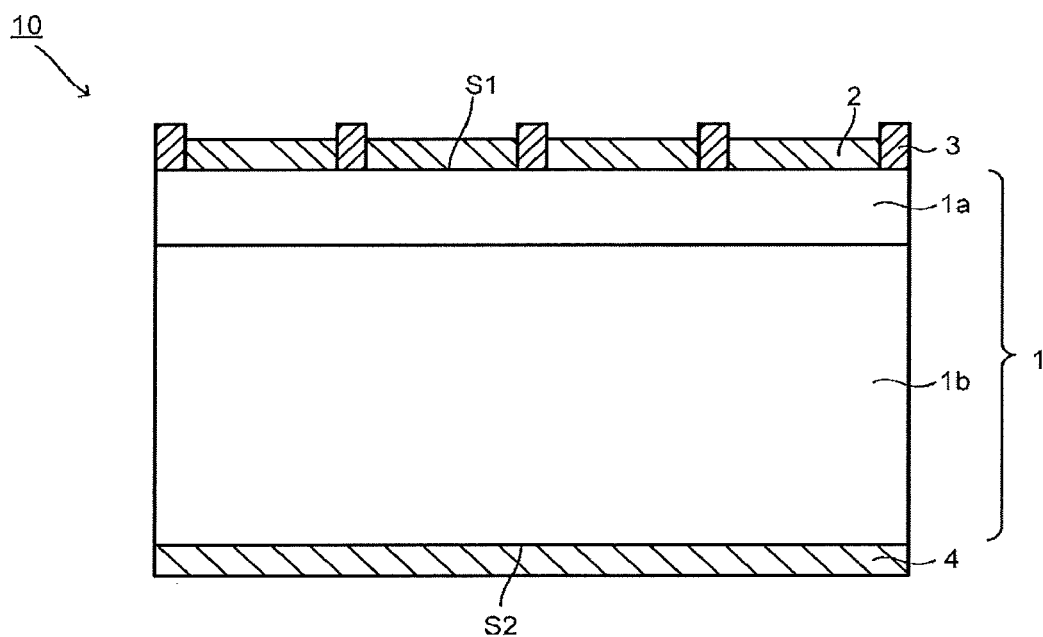
FIG. 1 is a diagram schematically illustrating a cross-section of a solar cell for evaluation, in which an electrode is formed using the glass powder in Example.

Embodiments of the present invention are described below.

<Glass Composition>

The glass composition in an aspect of the present invention includes, as expressed by mol % in terms of oxide, from 15 to 40% of PbO, from 25 to 50% of $MoO_3$, from 5 to 25% of $P_2O_5$, and from 7 to 15% of ZnO. In the following description, unless otherwise indicated, the "%" in the content of each component of the glass composition is an expression by mol % in terms of oxide. In the present description, a numerical range represented by using "to" indicate to include both upper limit and lower limit.

The content of each component in the glass composition is determined from the results of analysis for the obtained glass composition by Inductively Coupled Plasma-Atomic Emission Spectroscopy (ICP-AES) or Electron Probe Micro Analyzer (EPMA).

Since the glass composition contains $MoO_3$ in the above-described specific amount expressed by mol % in terms of oxide, the glass composition has conductivity. Accordingly, when the glass composition is used for a conductive paste, the conductivity of the obtained electrode can be increased.

Since the glass composition contains PbO, $P_2O_5$ and ZnO each in the above-described specific amount, a reaction of the glass composition with an antireflection film on a semiconductor substrate or with the silicon substrate, which is necessary for increasing the electrical properties as a solar cell, can be achieved. In addition, low temperature sinterability can be realized, and furthermore, the stability of the glass composition can be enhanced.

In the glass composition, PbO is an essential component. PbO can react with an antireflection film or a silicon substrate and has a function of enhancing softening fluidity of the glass composition. Thanks to this function, when an electrode is formed on a semiconductor substrate or the like by using the glass composition as a conductive paste, the electrical resistance between the electrode and the substrate or the like can be decreased, or the bond strength can be enhanced.

The glass composition contains PbO in a ratio of 15% or more and 40% or less. When the content of PbO is less than 15%, the reactivity with an antireflection film or a silicon substrate decreases, and the glass transition temperature increases, and therefore, the fluidity lowers. In this case, for example, when an electrode is formed as described above, the electrical resistance between the semiconductor substrate and the electrode may be increased, or the bond strength may not be sufficient. The content of PbO is preferably 20% or more, more preferably 22% or more. On the other hand, when the content of PbO exceeds 40%, the glass composition is not obtained due to crystallization. The content of PbO is preferably 35% or less, more preferably 33% or less.

In the glass composition, $MoO_3$ is an essential component. $MoO_3$ has, as an oxide, a very large work function compared with other oxides and has a function of increasing the conductivity of the glass composition. Accordingly, when the glass composition is incorporated together with a conductive component into a conductive paste and used for the formation of an electrode of a solar cell, the conductivity of the electrode is increased, and as a result, the efficiency of the solar cell can be increased. In addition, the component also has an effect of decreasing the glass transition temperature and when $MoO_3$ is contained, a glass composition capable of being sintered at low temperatures can be provided.

The glass composition contains $MoO_3$ in a ratio of 25% or more and 50% or less. When the content of $MoO_3$ is less than 25%, the conductivity of the glass composition decreases, and the electroconductivity is not sufficient. The content of $MoO_3$ is preferably 30% or more. On the other hand, when the content of $MoO_3$ exceeds 50%, the glass composition is not obtained due to crystallization. The content of $MoO_3$ is preferably 48% or less, more preferably 45% or less.

In the glass composition, $P_2O_5$ is an essential component. $P_2O_5$ is a component capable of enhancing the stability of the glass composition. The glass composition contains $P_2O_5$ in a ratio of 5% or more and 25% or less. When the content of $P_2O_5$ is less than 5%, vitrification is difficult. The content of $P_2O_5$ is preferably 10% or more. When the content of $P_2O_5$ exceeds 25%, the weather resistance such as water resistance is decreased. The content of $P_2O_5$ is preferably 20% or less, more preferably 18% or less.

In the glass composition, ZnO is an essential component. ZnO is a component capable of preventing crystallization of the glass and enhancing the reactivity with an antireflection film on a semiconductor substrate such as silicon substrate or with the silicon substrate. The glass composition contains ZnO in a ratio of 7% or more and 15% or less. When the content of ZnO is less than 7%, the reactivity with an antireflection film on a semiconductor substrate such as silicon substrate or with the silicon substrate is reduced, and the electrical resistance between the electrode and the semiconductor substrate increases. The content of ZnO is preferably 8% or more. When the content of ZnO exceeds 15%, the weather resistance such as water resistance is decreased. The content of ZnO is preferably 14% or less.

The glass composition preferably further contains $Li_2O$. $Li_2O$ has a function of enhancing the conductivity of the glass composition and increasing the softening fluidity. The content of $Li_2O$ is preferably 1% or more and 15% or less. When the content of $Li_2O$ is less than 1%, sufficient conductivity may not be obtained or fluidity may not be obtained due to the increase of the glass softening point. The content of $Li_2O$ is preferably 2% or more. When the content of $Li_2O$ exceeds 15%, vitrification may be difficult. The content of $Li_2O$ is preferably 12% or less.

The glass composition preferably further contains $WO_3$. $WO_3$ has a function of enhancing the conductivity of the glass composition. The content of $WO_3$ is preferably 1% or more and 25% or less. When the content of $WO_3$ is less than 1%, sufficient conductivity may not be obtained. The content of $WO_3$ is preferably 2% or more. When the content of $WO_3$ exceeds 25%, the glass transition temperature may be increased, and sufficient fluidity may not be obtained during sintering. The content of $WO_3$ is preferably 20% or less.

The glass composition may optionally contain any component(s) other than PbO, $MoO_3$, $P_2O_5$, ZnO, $Li_2O$ and $WO_3$. Examples of the other component include $Cr_2O_3$, $TiO_2$, and F. As for the other component, depending on the purpose, one kind may be used alone, or two or more kinds may be used in combination.

$Cr_2O_3$ has a function of increasing the conductivity and is preferably contained in a ratio of 0.1% or more and 15% or less.

$TiO_2$ has a function of enhancing the weather resistance such as water resistance and is preferably contained in a ratio of 0.1% or more and 10% or less.

F has a function of adjusting the stabilization of glass, enhancing the bond strength, and controlling the glass transition temperature, and is preferably contained in a ratio of 0.1% or more and 10% or less.

Furthermore, specific examples of the other optional component include various oxide components used in a normal glass composition, such as $B_2O_3$, $Bi_2O_3$, $Al_2O_3$, $As_2O_5$, $Sb_2O_5$, $TeO_2$, $Ga_2O_3$, $In_2O_3$, $SiO_2$, MgO, CaO, SrO, BaO, $Na_2O$, $K_2O$, $ZrO_2$, FeO, $Fe_2O_3$, CuO, $Sb_2O_3$, SnO, $SnO_2$, $V_2O_5$, MnO, $MnO_2$ and $CeO_2$.

Depending on the purpose, one of these other optional components is used alone, or two or more thereof are used in combination. As for the other optional component, the content of each component is preferably 48% or less, more preferably 40% or less. Furthermore, the total content of other optional components is preferably 48% or less, more preferably 40% or less.

In the glass composition, the glass transition temperature is preferably 300° C. or more and 450° C. or less. When the glass transition temperature is less than 300° C., the fluidity of the glass composition is higher than necessary during sintering. When the fluidity of the glass composition is too high, in the case of using the composition for a conductive paste, the conductive component and the glass composition may be separated, failing in exerting sufficient conductivity in the obtained electrode. When the glass transition temperature exceeds 450° C., the glass composition may be unable to satisfactorily flow during sintering, resulting in unstable properties. The glass transition temperature is more preferably 320° C. or more and 420° C. or less.

The glass transition temperature is obtained by determining the first bending point from a DTA chart prepared through measurement at a temperature rise rate of 10° C./min in a differential thermal analysis (DTA) apparatus, TG8110, manufactured by Rigaku Corp.

The method for producing the glass composition is not particularly limited. For example, the glass composition can be produced by the following method.

First, a raw material mixture is prepared. The raw materials are not particularly limited as long as they are usually used for the production of a normal oxide-based glass composition, and an oxide, a carbonate, or the like may be used. The raw material mixture is formed by appropriately adjusting the kinds and ratio of raw materials to satisfy the composition range above in the obtained glass composition.

The raw material mixture is then heated by a known method to obtain a melt thereof. The temperature (melting temperature) at which heating and melting is performed is preferably from 800 to 1,400° C., more preferably from 900 to 1,300° C. The heating and melting time is preferably from 30 to 300 minutes.

After that, the melt is cooled and solidified, thereby obtaining the glass composition. The cooling method is not particularly limited. A method of rapidly cooling the melt by dropping on a roll-out machine, a press machine, or a cooling liquid may be employed. It is preferred that the obtained glass composition is completely amorphous, i.e., the crystallization degree is 0%. However, the composition may include a crystallized portion as long as the effects are not impaired.

The thus-obtained glass composition may take any form and, for example, may be in the form of a block, a plate, a thin plate (flake) or a powder.

The glass composition has conductivity and has a function as a binding agent and is preferably used for a conductive paste. A conductive paste containing the glass composition has enhanced conductivity and is suitably used, for example, for the formation of an electrode of a solar cell. In the case of incorporating the glass composition into a conductive paste, the glass composition is preferably in a form of a powder.

<Glass Powder>

The glass powder in an aspect of the present invention includes the glass composition and preferably has $D_{50}$ of 0.3 μm or more and 2.0 μm or less. This range of $D_{50}$ is a particularly favorable range for use in a conductive paste. When $D_{50}$ is 0.3 μm or more, the dispersibility when formed into a conductive paste is more enhanced. In addition, when $D_{50}$ is 2.0 μm or less, a portion in which a glass powder is absent around a conductive metal powder is less likely to be generated, and therefore, the adhesion between an electrode and a semiconductor substrate is more enhanced. In this case, $D_{50}$ is more preferably 0.5 μm or more. $D_{50}$ is more preferably 1.8 μm or less.

In the present disclosure, "$D_{50}$" indicates a 50% particle diameter on a volume basis in the cumulative particle size distribution, and specifically, "$D_{50}$" represents a particle diameter when its accumulated amount accounts for 50% on a volume basis in a cumulative particle size curve of particle diameter distribution that is measured using a laser diffraction/scattering particle size distribution measuring apparatus.

The glass powder can be obtained by milling the glass composition produced as described above, for example, by a dry milling method or a wet milling method so as to have the above-described specific particle size distribution.

A glass milling method for obtaining the glass powder is preferably, for example, a method in which the glass composition with an appropriate shape is dry-milled and then wet-milled. The dry milling and wet milling can be performed using, for example, a mill such as roll mill, ball mill and jet mill. The particle size distribution can be adjusted, for example, by adjusting the milling time in each milling or adjusting the conditions of the mill such as ball size of a ball mill. In the case of a wet milling method, water is preferably used as the solvent. After the wet milling, water is removed by drying to obtain a glass powder. In order to adjust the particle diameter of the glass powder, classification may be performed, if desired, in addition to the milling of the glass.

<Conductive Paste>

The glass composition can be applied, for example, as a glass powder to the conductive paste in an aspect of the present invention. The conductive paste using the glass composition contains the glass powder, a conductive metal powder, and an organic vehicle.

As for the conductive metal powder contained in the conductive paste, a powder of a metal usually employed for an electrode formed on a circuit board (including a laminated electronic component) such as semiconductor substrate or insulating substrate can be used without particular limitation. Specific examples of the conductive metal powder include powders of Al, Ag, Cu, Au, Pd, Pt, and the like and among these, an Ag powder is preferred from the viewpoint of productivity. From the viewpoint of preventing aggregation and achieving uniform dispersibility, the particle diameter $D_{50}$ of the conductive metal powder is preferably 0.3 μm or more and 10 μm or less.

The content of the glass powder in the conductive paste is, for example, preferably 0.1 part by mass or more and 10 parts by mass or less per 100 parts by mass of the conductive metal powder. When the content of the glass powder is less than 0.1 parts by mass, it may be impossible to cover the periphery of the conducive metal powder with glass deposits. In addition, the adhesion between the electrode and a circuit board such as semiconductor substrate or insulating substrate may be reduced. On the other hand, when the content of the glass powder exceeds 10 parts by mass, the conductive metal powder is likely to be excessively sintered to cause glass floatation, or the like. The content of the glass powder per 100 parts by mass of the conductive metal powder is more preferably 0.5 part by mass or more and 5 parts by mass or less.

As the organic vehicle contained in the conductive paste, an organic resin binder solution obtained by dissolving an organic resin binder in a solvent can be used.

As the organic resin binder used for the organic vehicle, examples thereof include an organic resin, for example, a cellulose-based resin such as methyl cellulose, ethyl cellulose, carboxymethyl cellulose, oxyethyl cellulose, benzyl cellulose, propyl cellulose and nitrocellulose, and an acrylic resin obtained by polymerizing one or more acrylic monomers, such as methyl methacrylate, ethyl methacrylate, butyl methacrylate, 2-hydroxyethyl methacrylate, butyl acrylate and 2-hydroxyethyl acrylate.

As the solvent used for the organic vehicle, in the case of a cellulose-based resin, preferable examples thereof include a solvent such as terpineol, butyl diglycol acetate, ethyl diglycol acetate and propylene glycol diacetate, and in the case of an acrylic resin, preferable examples thereof include a solvent such as methyl ethyl ketone, terpineol, butyl diglycol acetate, ethyl diglycol acetate, and propylene glycol diacetate.

The ratio of the organic resin binder and the solvent in the organic vehicle is not particularly limited but is selected so as to afford a viscosity enabling an organic resin binder solution to adjust the viscosity of the conductive paste. Specifically, the mass ratio represented by "organic resin binder:solvent" is preferably approximately from 3:97 to 15:85.

The content of the organic vehicle in the conductive paste is preferably 2 mass % or more and 30 mass % or less relative to the total amount of the conductive paste. When the content of the organic vehicle is less than 2 mass %, the viscosity of the conductive paste may rise, and the coatability of the conductive paste, such as printing, may be therefore reduced, making it difficult to form a good conductive layer (electrode). In addition, when the content of the organic vehicle exceeds 30 mass %, the content ratio of solid content in the conductive paste may decrease, and a sufficient coating film thickness may be hardly obtained.

In the conductive paste, in addition to the above-described glass powder, conductive metal powder and organic vehicle, known additives may be blended, if desired, as long as they do not contradict the purpose of the present invention.

Examples of the additives include various inorganic oxides. Specific examples of the inorganic oxide include $B_2O_3$, $SiO_2$, $Al_2O_3$, $TiO_2$, MgO, $ZrO_2$, $Sb_2O_3$, a composite oxide thereof, and the like. Such an inorganic oxide is effective in alleviating sintering of the conductive metal powder during sintering of the conductive paste and in turn, has an action of adjusting the bond strength after firing. The size of the additive including such an inorganic oxide is not particularly limited, but those having $D_{50}$ of 10 μm or less may be favorably used.

The content of the inorganic oxide in the conductive paste is appropriately set depending on the purpose but is preferably 10 mass % or less, more preferably 7 mass % or less, relative to the glass powder. When the content of the inorganic oxide relative to the glass powder exceeds 10 mass %, the fluidity of the conductive paste during the electrode formation may lower, leaving a possibility that the adhesive strength between the electrode and a circuit board such as semiconductor substrate or insulating substrate is reduced. Furthermore, in order to obtain a practical blending effect (adjustment of the bond strength after firing), the lower limit of the content of the inorganic oxide is preferably 0.5 mass %, more preferably 1.0 mass %.

In the conductive paste, additives known in the field of a conductive paste, such as defoamer or dispersant, may be added. The organic vehicle and these additives usually disappears in the process of forming an electrode. For the preparation of the conductive paste, a known method using a rotary mixer with stirring blade, a mortar, a roll mill, a ball mill, or the like may be applied.

Coating a circuit board such as semiconductor substrate or insulating substrate with the conductive paste and firing it can be performed by the same methods as the coating and firing in the conventional electrode formation. Examples of the coating method include screen printing, dispensing, and the like. The firing temperature varies depending on the kind of the conductive metal powder contained, the surface state, or the like, but for example, a temperature of approximately from 500 to 1,000° C. may be exemplified. The firing time is appropriately adjusted depending on the shape or thickness of the electrode to be formed. In addition, a drying treatment at approximately from 80 to 200° C. may be provided between coating and firing of the conductive paste.

<Solar Cell>

The solar cell in an aspect of the present invention includes an electrode formed with the conductive paste, specifically, an electrode metalized on a semiconductor substrate. In the solar cell, at least one electrode is preferably an electrode provided with the conductive paste by fire-through in the form of partially penetrating an insulating film to come into contact with a semiconductor substrate.

As the insulating film-penetrating electrode possessed by a solar cell, examples thereof include an electrode provided as an electrode on a light-receiving surface of a solar cell using a pn-junction type semiconductor substrate, in the form of partially penetrating an insulating film serving as an antireflection film to come into contact with a semiconductor substrate. As the insulating material constituting the insulating film serving as an antireflection film, examples thereof include silicon nitride, titanium dioxide, silicon dioxide, aluminum oxide, and the like. In this case, the light-receiving surface may be one surface or both surfaces of the semiconductor substrate, and the semiconductor substrate may be either n-type or p-type. The electrode thus provided on a light-receiving surface of a solar can be formed with the conductive paste by fire-through.

EXAMPLES

The present invention is described in greater detail below by referring to Examples, but the present invention is not limited to these. Cases 1 to 22 are Examples and Cases 23 to 27 are Comparative Examples.
(Cases 1 to 27)

A glass composition was produced as a thin plate-like glass by the following method, and a glass powder was produced from the thin plate-like glass. The particle size distribution of the glass powder was measured, and the glass transition temperature of the glass composition was measured using the glass powder.
<Production of Glass Composition (Thin Plate-Like Glass)>

Law material powders were blended to have the composition shown in Tables 1 to 3, mixed and melted for 30 minutes to 1 hour by using a crucible in an electric furnace at 900 to 1,200° C., thereby forming a thin plate-like glass composed of a glass composition.
<Production of Glass Powder>

In each of Cases, the obtained thin plate-like glass was milled with the combination of the dry milling and the wet milling as follows, thereby adjusting the particle size distribution. The particle size distribution of the obtained glass powder was measured, and the glass transition temperature of the glass composition was measured using the glass powder.

The thin plate-like glass was dry-milled for 6 hours in a ball mill, and coarse particles were removed by means of a 150-mesh sieve. Subsequently, the glass powder obtained after dry milling and removal of coarse particles was wet-milled using water in a ball mill so as to have $D_{50}$ in a predetermined range, and then, a glass powder having a desired particle size distribution was produced. In the wet milling, an alumina-made ball having a diameter of 5 mm was used so as to obtain the predetermined $D_{50}$. Thereafter, the slurry obtained by the wet milling was filtered and dried at 130° C. in a drier for removing water, thereby producing a glass powder.
<Evaluation>

With respect to the glass composition in each of Cases, the glass transition temperature and $D_{50}$ of the glass powder were evaluated by the following methods. The results are shown together with the composition in Tables 1 to 3. In the column of each component of the glass composition, the blank column indicates a content of "0%".
(Glass Transition Temperature)

The obtained glass powder was packed in an aluminum-made pan and measured at a temperature rise rate of 10° C./min by using a differential thermal analyzer, TG8110, manufactured by Rigaku Corp. The first bending point of a DTA chart obtained by the measurement was defined as the glass transition temperature.
($D_{50}$)

0.02 g of the glass powder was mixed with 60 cc of water and dispersed in water for 1 minute by ultrasonic dispersion. The sample was charged into a Microtrac measuring apparatus (laser diffraction/scattering particle size distribution measuring apparatus), and the value of $D_{50}$ was obtained.
<Production of Conductive Paste>

A conductive paste for Ag electrode formation, containing each of the glass powders in Cases 1 to 27 prepared above, was manufactured.

First, 95 parts by mass of butyl diglycol acetate was mixed with 5 parts by mass of ethyl acetate, and the mixture was stirred at 85° C. for 2 hours to prepare an organic vehicle. Next, 15 parts by mass of the thus-obtained organic vehicle was mixed with 85 parts by mass of Ag powder (produced by DOWA Electronics Materials Co., Ltd., spherical silver powder: AG-4-8F), and the mixture was kneaded for 10 minutes by means of a mortar. Thereafter, the glass powder was blended in a ratio of 2 parts by mass per 100 parts by mass of Ag powder, and the mixture was further kneaded for 90 minutes by means of a mortar, thereby making a conductive paste for Ag electrode formation.
<Production of Solar Cell>

Using the conductive paste for Ag electrode formation obtained above and a conductive paste for Al electrode formation available on the market, a solar cell 10 having a configuration illustrated in FIG. 1 was produced by forming, on a p-type Si semiconductor substrate 1, an Al electrode 4 as a back electrode on a non-light-receiving surface S2 and an Ag electrode 3 as a surface electrode on a light-receiving surface S1 as follows.

Using a p-type crystalline Si semiconductor substrate sliced at a thickness of 160 μm, first, the light-receiving surface and the non-light-receiving surface were subjected to an etching treatment with approximately a very small amount of hydrofluoric acid so as to clean the sliced surfaces of the Si semiconductor substrate. Thereafter, on the crystalline Si semiconductor substrate surface on the light-receiving surface side, a concave/convex structure (not shown in FIG. 1) that decreases the light reflectance was formed using a wet etching method. Furthermore, an n-type layer 1a was formed by diffusion on the light-receiving surface of the Si semiconductor substrate. As the doping element for forming the n-type layer, P (phosphorus) was used. In this way, a p-type Si semiconductor substrate 1 composed of the n-type layer 1a and a p-type layer 1b was obtained. Subsequently, an antireflection film 2 was formed on the light-receiving surface (n-type layer surface) S1 of the Si semiconductor substrate 1. As the material of the antireflection film 2, silicon nitride was mainly used, and the film was formed to have a thickness of 80 nm by plasma CVD.

After that, an Ag electrode and an Al electrode were formed respectively on the light-receiving surface side and the non-light-receiving surface side of the obtained Si semiconductor substrate with the antireflection film. First, the surface on the light-receiving surface side, i.e., the surface of the antireflection film 2, was linearly coated with an Al paste by screen printing and dried at 120° C.

Subsequently, the conductive paste for Ag electrode formation obtained using each of the glass powders in Cases 1 to 27 was applied by screen printing over the entire surface of the non-light-receiving surface S2 of the Si semiconductor substrate 1. Thereafter, firing was performed using an infrared heating belt furnace at a peak temperature of 800° C. for 100 seconds to form a surface Ag electrode 3 and a back Al electrode 4, thereby forming a solar cell 10. The Ag electrode 3 was formed by firing in the form of penetrating the antireflection film 2 to come into contact with the n-type layer 1a of the Si semiconductor substrate 1.

(Measurement of Conversion Efficiency of Solar Cell)

The conversion efficiency of the solar cell produced using the conductive paste for Ag electrode formation containing each of the glass powders in the above-described Cases was measured using a solar simulator. Specifically, the solar cell was disposed on the solar simulator, and the current-voltage characteristics were measured in conformity with JIS C8912 (1998) under standard sunlight by spectral characteristics of AM1.5G to derive the conversion efficiency of each solar cell. The obtained results of the conversion efficiency are shown in Tables 1 to 3.

In the Tables, symbols have the following meanings.

Isc (A): Short-circuit current in a short-circuit condition.

Voc (mV): Open-circuit voltage in an open-circuit condition.

FF (%): Fill factor.

Eff (%): Conversion efficiency.

It is found from Tables 1 and 2 that in the case of using the glass powders in Cases 1 to 22, FF was 70% or more and a conversion efficiency Eff of 18% or more could be obtained. On the other hand, it is found from Table 3 that in the case of using the glass powders in Cases 23 to 27, the conversion efficiency was less than 18%.

Figure 2:
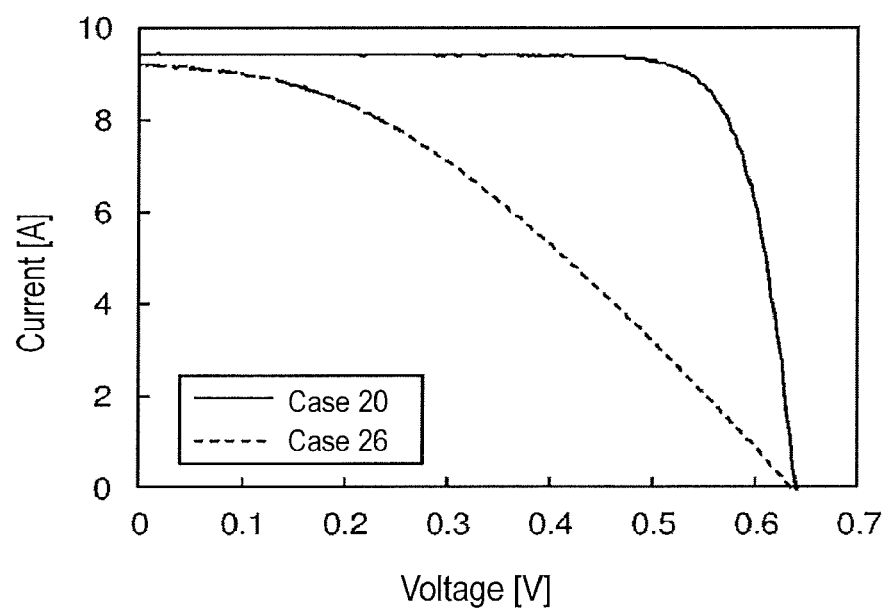
FIG. 2 is a graph illustrating the measurement results of current-voltage characteristics obtained by measuring a solar cell in which an electrode is formed using the glass composition obtained in each of Example and Comparative Example.

FIG. 2 illustrates the measurement results of current-voltage characteristics obtained by measuring a solar cell in which the electrode was formed using the glass composition obtained in Case 20 (Example) and Case 26 (Comparative Example). It is found from FIG. 2 that in Case 20, although the voltage was 0.5 V, a current of 8 A or more could be maintained, as compared with Case 26.

TABLE 1

| | | Case 1 | Case 2 | Case 3 | Case 4 | Case 5 | Case 6 | Case 7 | Case 8 | Case 9 | Case 10 | Case 11 |
|---|---|---|---|---|---|---|---|---|---|---|---|---|
| Glass Composition (mol %) | PbO | 29.5 | 28.1 | 26.8 | 28.1 | 26.8 | 26.1 | 25.5 | 24.3 | 28.6 | 30.3 | 26.1 |
| | $MoO_3$ | 41.7 | 39.7 | 37.9 | 39.7 | 37.9 | 37.0 | 36.1 | 34.5 | 37.0 | 36.1 | 39.4 |
| | $P_2O_5$ | 15.7 | 15.0 | 14.3 | 15.0 | 14.3 | 14.0 | 13.6 | 13.0 | 14.0 | 13.6 | 14.0 |
| | ZnO | 13.1 | 12.4 | 11.9 | 12.4 | 11.9 | 11.6 | 11.3 | 10.8 | 11.6 | 11.3 | 11.6 |
| | $Li_2O$ | | | | | | | | | | | |
| | $WO_3$ | | 4.8 | 9.1 | | | 11.3 | 13.5 | 17.4 | 8.8 | 8.7 | 8.9 |
| | $Cr_2O_3$ | | | | 4.8 | 9.1 | | | | | | |
| | $TiO_2$ | | | | | | | | | | | |
| | F | | | | | | | | | | | |
| Glass transition Temperature (° C.) | | 379 | 384 | 389 | 383 | 390 | 391 | 394 | 398 | 387 | 385 | 385 |
| Particle size distribution (μm) | $D_{50}$ | 0.81 | 0.78 | 0.79 | 0.84 | 0.81 | 0.77 | 0.75 | 0.83 | 0.73 | 0.74 | 0.77 |
| Characteristics of cell | Isc (A) | 9.28 | 9.25 | 9.29 | 9.31 | 9.27 | 9.31 | 9.28 | 9.28 | 9.29 | 9.27 | 9.28 |
| | Voc (mV) | 636 | 637 | 635 | 636 | 635 | 636 | 636 | 635 | 635 | 635 | 636 |
| | FF (%) | 78.1 | 78.3 | 79.0 | 74.7 | 76.5 | 79.6 | 79.3 | 78.6 | 79.9 | 79.8 | 79.4 |
| | Eff (%) | 18.9 | 18.9 | 19.1 | 18.1 | 18.4 | 19.3 | 19.2 | 18.9 | 19.3 | 19.2 | 19.2 |

TABLE 2

| | | Case 12 | Case 13 | Case 14 | Case 15 | Case 16 | Case 17 | Case 18 | Case 19 | Case 20 | Case 21 | Case 22 |
|---|---|---|---|---|---|---|---|---|---|---|---|---|
| Glass Composition (mol %) | PbO | 25.5 | 26.1 | 25.5 | 24.9 | 24.3 | 26.7 | 24.9 | 24.3 | 27.1 | 27.1 | 26.3 |
| | $MoO_3$ | 40.9 | 37.0 | 36.1 | 35.3 | 34.4 | 34.4 | 35.3 | 34.4 | 34.9 | 34.9 | 33.9 |
| | $P_2O_5$ | 13.6 | 14.0 | 13.6 | 13.3 | 13.0 | 13.0 | 13.3 | 13.0 | 13.2 | 13.2 | 12.7 |
| | ZnO | 11.3 | 11.6 | 11.3 | 11.0 | 10.8 | 10.8 | 11.0 | 10.8 | 9.4 | 9.4 | 12.1 |
| | $Li_2O$ | | 2.4 | 4.8 | 7.1 | 9.3 | 4.5 | 4.7 | 4.5 | 4.6 | 4.6 | 4.5 |
| | $WO_3$ | 8.7 | 8.9 | 8.7 | 8.4 | 8.2 | 10.6 | 8.4 | 8.2 | 10.8 | 10.8 | 10.5 |
| | $Cr_2O_3$ | | | | | | | | | | | |
| | $TiO_2$ | | | | | | | | 2.4 | | | |
| | F | | | | | | | | | 4.8 | | |
| Glass transition Temperature (° C.) | | 381 | 371 | 361 | 350 | 342 | 362 | 364 | 359 | 366 | 364 | 362 |
| Particle size distribution (μm) | $D_{50}$ | 0.75 | 0.81 | 0.85 | 0.89 | 0.97 | 0.78 | 0.86 | 0.79 | 0.76 | 1.41 | 0.74 |
| Characteristics of cell | Isc (A) | 9.30 | 9.28 | 9.29 | 9.31 | 9.30 | 9.37 | 9.36 | 9.34 | 9.41 | 9.26 | 9.36 |
| | Voc (mV) | 636 | 636 | 635 | 637 | 636 | 638 | 638 | 638 | 639 | 637 | 637 |
| | FF (%) | 79.2 | 79.8 | 80.0 | 78.3 | 76.3 | 79.9 | 75.6 | 79.4 | 80.4 | 79.3 | 80.7 |
| | Eff (%) | 19.2 | 19.3 | 19.3 | 19.0 | 18.5 | 19.5 | 18.4 | 19.3 | 19.7 | 19.6 | 19.7 |

TABLE 3

|  |  | Case 23 | Case 24 | Case 25 | Case 26 | Case 27 |
|---|---|---|---|---|---|---|
| Glass Composition (mol %) | PbO | 33.9 | 32.3 | 28.2 | 4.8 | 4.5 |
|  | MoO$_3$ | 48.0 | 45.7 | 40.0 | 76.2 | 72.7 |
|  | P$_2$O$_5$ | 18.1 | 17.2 | 15.1 | 4.7 | 9.1 |
|  | ZnO |  | 4.8 | 16.7 |  |  |
|  | Bi$_2$O$_3$ |  |  |  | 14.3 | 13.7 |
| Glass transition Temperature (° C.) |  | 398 | 357 | 376 | 322 | 336 |
| Particle size distribution (μm) | D$_{50}$ | 0.81 | 0.56 | 0.78 | 0.51 | 0.53 |
| Characteristics of cell | Isc (A) | 9.19 | 9.30 | 9.22 | 9.19 | 9.23 |
|  | Voc (mV) | 634 | 636 | 635 | 634 | 636 |
|  | FF (%) | 55.7 | 56.2 | 62.7 | 37.4 | 49.2 |
|  | Eff (%) | 13.3 | 13.6 | 15.0 | 8.9 | 11.8 |

As seen from Tables 1 to 3, the glass compositions and glass powders in Cases 1 to 22 which are Examples are suitable for the formation of an electrode of a solar cell, as compared with the glass compositions and glass powders in Cases 23 to 27 which are Comparative Examples.

While the present invention has been described in detail and with reference to specific embodiments thereof, it will be apparent to one skilled in the art that various changes and modifications can be made therein without departing from the spirit and scope thereof.

This application is based on Japanese Patent Application No. 2017-215522 filed on Nov. 8, 2017, the entire subject matters of which are incorporated herein by reference.

DESCRIPTION OF REFERENCE NUMERALS AND SIGNS

10: Solar cell
1: p-type Si semiconductor substrate
1a: n-type layer
1b: p-type layer
2: Antireflection film
3: Ag electrode
4: Al electrode
S1: Light-receiving surface
S2: Non-light-receiving surface

The invention claimed is:

1. A glass composition comprising, as expressed by mol % in terms of oxide:
   from 15 to 40% of PbO;
   from 25 to 50% of MoO$_3$;
   from 5 to 25% of P$_2$O$_5$; and
   from 7 to 15% of ZnO.

2. The glass composition according to claim 1, further comprising, expressed by mol % in terms of oxide, from 1 to 15% of Li$_2$O.

3. The glass composition according to claim 2, further comprising, expressed by mol % in terms of oxide, from 1 to 25% of WO$_3$.

4. The glass composition according to claim 3, which has a glass transition temperature of from 300 to 450° C.

5. A glass powder comprising the glass composition according to claim 4, which has D$_{50}$ of from 0.3 to 2.0 μm, wherein D$_{50}$ is a 50% particle diameter in a volume-based cumulative particle size distribution.

6. A glass powder comprising the glass composition according to claim 3, which has D$_{50}$ of from 0.3 to 2.0 μm, wherein D$_{50}$ is a 50% particle diameter in a volume-based cumulative particle size distribution.

7. The glass composition according to claim 2, which has a glass transition temperature of from 300 to 450° C.

8. A glass powder comprising the glass composition according to claim 7, which has D$_{50}$ of from 0.3 to 2.0 μm, wherein D$_{50}$ is a 50% particle diameter in a volume-based cumulative particle size distribution.

9. A glass powder comprising the glass composition according to claim 2, which has D$_{50}$ of from 0.3 to 2.0 μm, wherein D$_{50}$ is a 50% particle diameter in a volume-based cumulative particle size distribution.

10. The glass composition according to claim 1, further comprising, expressed by mol % in terms of oxide, from 1 to 25% of WO$_3$.

11. The glass composition according to claim 10, which has a glass transition temperature of from 300 to 450° C.

12. A glass powder comprising the glass composition according to claim 11, which has D$_{50}$ of from 0.3 to 2.0 μm, wherein D$_{50}$ is a 50% particle diameter in a volume-based cumulative particle size distribution.

13. A glass powder comprising the glass composition according to claim 10, which has D$_{50}$ of from 0.3 to 2.0 μm, wherein D$_{50}$ is a 50% particle diameter in a volume-based cumulative particle size distribution.

14. The glass composition according to claim 1, which has a glass transition temperature of from 300 to 450° C.

15. A glass powder comprising the glass composition according to claim 14, which has D$_{50}$ of from 0.3 to 2.0 μm, wherein D$_{50}$ is a 50% particle diameter in a volume-based cumulative particle size distribution.

16. A glass powder comprising the glass composition according to claim 1, which has D$_{50}$ of from 0.3 to 2.0 μm, wherein D$_{50}$ is a 50% particle diameter in a volume-based cumulative particle size distribution.

17. A conductive paste comprising the glass powder according to claim 16, a conductive metal powder, and an organic vehicle.

18. A solar cell comprising an electrode formed with the conductive paste according to claim 17.

* * * * *